US012620968B2

(12) United States Patent
Nishimura

(10) Patent No.: US 12,620,968 B2
(45) Date of Patent: May 5, 2026

(54) QUARTZ CRYSTAL RESONATOR, QUARTZ CRYSTAL RESONATOR UNIT AND QUARTZ CRYSTAL OSCILLATOR

(71) Applicant: Murata Manufacturing Co., Ltd., Nagaokakyo (JP)

(72) Inventor: Toshio Nishimura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 910 days.

(21) Appl. No.: 17/940,133

(22) Filed: Sep. 8, 2022

(65) Prior Publication Data

US 2023/0006645 A1 Jan. 5, 2023

Related U.S. Application Data

(63) Continuation of application No. PCT/JP2020/041942, filed on Nov. 10, 2020.

(30) Foreign Application Priority Data

Mar. 19, 2020 (JP) ................................. 2020-049701

(51) Int. Cl.
*H03H 9/00* (2006.01)
*H03H 3/02* (2006.01)
*H03H 9/19* (2006.01)
(52) U.S. Cl.
CPC ................ *H03H 9/19* (2013.01); *H03H 3/02* (2013.01)

(58) Field of Classification Search
CPC ........ H03H 9/19; H03H 3/02; H03H 9/02023; H03H 9/0547; H03H 9/1021
See application file for complete search history.

(56) References Cited

U.S. PATENT DOCUMENTS

2018/0076792 A1* 3/2018 Asai ................... H03H 9/02023
2019/0149124 A1* 5/2019 Kaga ................. H03H 9/02023
310/344

FOREIGN PATENT DOCUMENTS

| JP | H07297663 A | 11/1995 |
| JP | 2002246866 A | 8/2002 |
| JP | 2003324332 A | 11/2003 |
| JP | 2019092148 A | 6/2019 |

OTHER PUBLICATIONS

International Search Report in PCT/JP2020/041942, mailed Jan. 26, 2021, 3 pages.

* cited by examiner

*Primary Examiner* — Julio C. Gonzalez
(74) *Attorney, Agent, or Firm* — ArentFox Schiff LLP

(57) ABSTRACT

A quartz crystal resonator that includes a quartz crystal element having main surfaces extending in a plane $\varphi$ degrees around a Z axis of the quartz crystal element and $\theta$ degrees around an X' axis of the quartz crystal element; and an electrode in contact with the quartz crystal element, where $x=t/T \geq 0.01$, $|\varphi-(-98.6x^3+114.0x^2-22.3x+1.3)| \leq 5$ and $|\theta-(-9.5x^3-10.9x^2+1.4x+35.3)| \leq 0.5$, wherein T is a thickness of the quartz crystal element and t is a thickness of the electrode.

20 Claims, 9 Drawing Sheets

QUARTZ CRYSTAL RESONATOR, QUARTZ CRYSTAL RESONATOR UNIT AND QUARTZ CRYSTAL OSCILLATOR

CROSS REFERENCE TO RELATED APPLICATIONS

The present application is a continuation of International application No. PCT/JP2020/041942, filed Nov. 10, 2020, which claims priority to Japanese Patent Application No. 2020-049701, filed Mar. 19, 2020, the entire contents of each of which are incorporated herein by reference

TECHNICAL FIELD

The present invention relates to a quartz crystal resonator, a quartz crystal resonator unit and a quartz crystal oscillator.

BACKGROUND ART

Resonator units are used in various electronic devices such as mobile communication terminals, communication base stations, and home appliances for applications such as timing devices, sensors, and oscillators, etc. As electronic devices become more functional, smaller and thinner resonators are required.

Patent Document 1 discloses a double-rotation Y-cut quartz crystal resonator having favorable frequency-temperature characteristics in a region on a temperature side higher than room temperature.

Patent Document 1: Patent Publication JP-A-2003-324332

SUMMARY

In the case of a low-frequency quartz crystal resonator, since the thickness of a quartz crystal element is large, and the ratio of the thickness of an electrode to the thickness of the quartz crystal element is small, the influence on the electrode is negligible in consideration of frequency-temperature characteristics. However, in the case of a high-frequency quartz crystal resonator, since the thickness of the quartz crystal element is small, the ratio of the thickness of the electrode to that of the quartz crystal element is large, and the electrode influences frequency-temperature characteristics. Therefore, frequency-temperature characteristics of the quartz crystal resonator described in Patent Document 1 and the AT-cut quartz crystal resonator may deteriorate in a high frequency range.

The present invention has been made in view of such circumstances, and an object of the present invention is to provide a quartz crystal resonator, a quartz crystal resonator unit and a quartz crystal oscillator which have favorable frequency-temperature characteristics.

A quartz crystal resonator according to one aspect of the present invention includes a quartz crystal element having main surfaces extending in a plane $\varphi$ degrees around a Z axis of the quartz crystal element and $\theta$ degrees around an X' axis of the quartz crystal element; and an electrode in contact with the quartz crystal element, where $x=t/T\geq0.01$, $|\varphi-(-98.6x^3+114.0x^2-22.3x+1.3)|\leq5$, and $|\theta-(-9.5x^3-10.9x^2+1.4x+35.3)|\leq0.5$, wherein T is a thickness of the quartz crystal element and t is a thickness of the electrode.

A quartz crystal resonator according to another aspect of the present invention includes a quartz crystal element having main surfaces extending in a plane $\varphi$ degrees around a Z axis of the quartz crystal element and $\theta$ degrees around an X' axis of the quartz crystal element; and an electrode in contact with the quartz crystal element, where $x=t/T\geq0.01$, and $|\varphi-(-0.017\theta^3+1.37\theta^2-37.6\theta+351)|\leq5$, wherein T is a thickness of the quartz crystal element and t is a thickness of the electrode.

According to the present invention, it is possible to provide a quartz crystal resonator, a quartz crystal resonator unit and a quartz crystal oscillator which have favorable frequency-temperature characteristics.

BRIEF DESCRIPTION OF THE DRAWINGS

FIG. 1 is an exploded perspective view schematically showing a configuration of a quartz crystal oscillator according to a first embodiment.

DETAILED DESCRIPTION OF THE PREFERRED EMBODIMENTS

Figure 2:
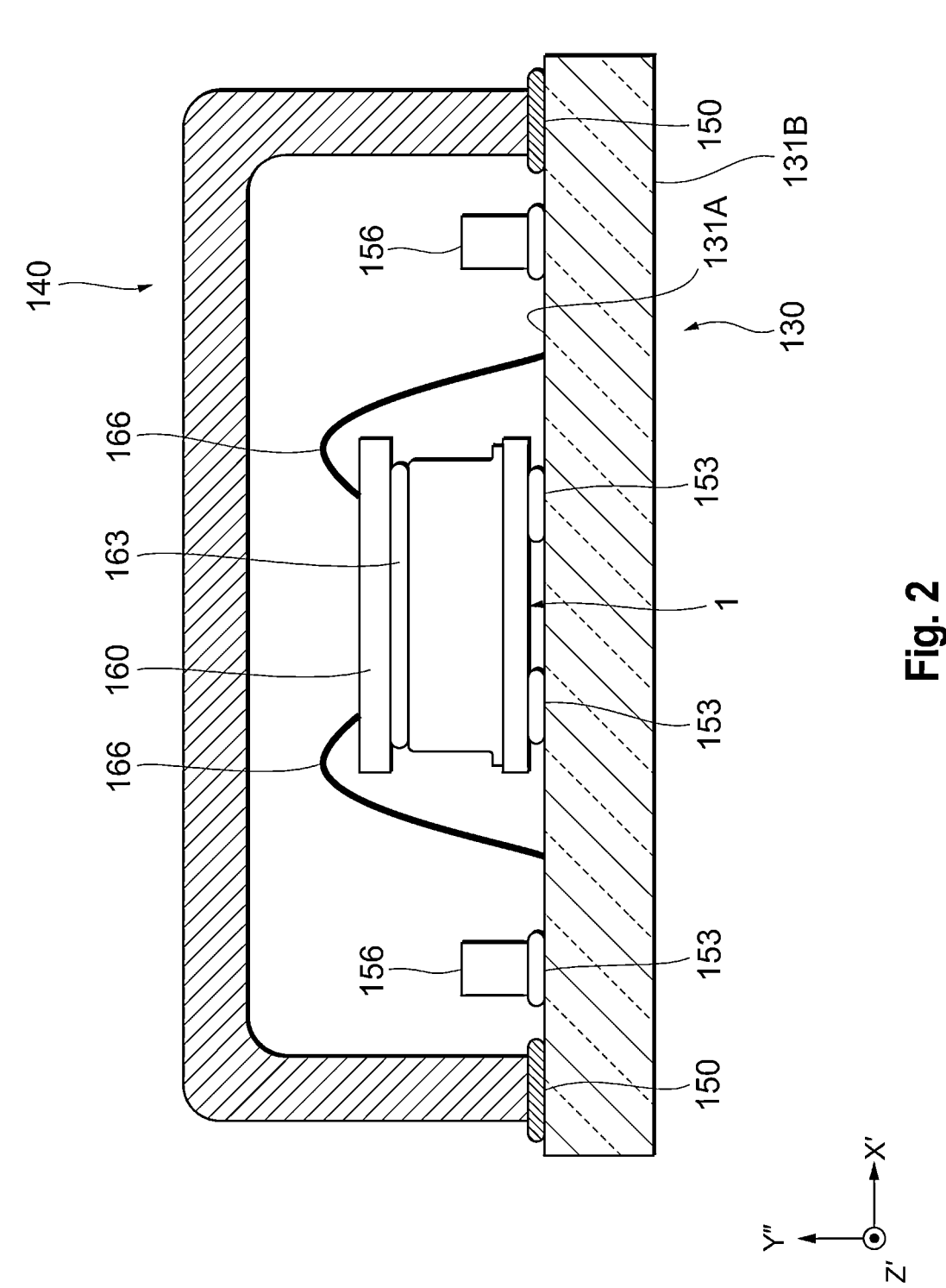
FIG. 2 is a cross-sectional view schematically showing a configuration of the quartz crystal oscillator according to the first embodiment.

Hereinafter, embodiments of the present invention will be described with reference to the drawings. The drawings of the embodiments are examples, and sizes and shapes of respective parts are schematically shown, and the technical scope of the present invention should not be understood as limited to the embodiments.

In the drawings, in order to clarify the relationship between the drawings and to help understanding the positional relationship of respective members, an orthogonal coordinate system composed of an X' axis, a Y" axis and a Z' axis is used for convenience. The X' axis, the Y" axis and the Z' axis correspond to each other in the drawings. The X' axis is an axis obtained by rotating an X axis once, the Y" axis is an axis obtained by rotating a Y axis twice, and the Z' axis is an axis obtained by rotating a Z axis once. The X axis, the Y axis and the Z axis correspond to crystallographic axes of the quartz crystal. The X axis corresponds to the electrical axis (polar axis) of the quartz crystal, the Y axis corresponds to the mechanical axis of the quartz crystal, and the Z axis corresponds to the optical axis of the quartz crystal. The X' axis, the Y" axis and the Z' axis will be described below in detail.

In the following description, a direction parallel to the X' axis is an "X' axis direction," a direction parallel to the Y" axis is a "Y" axis direction," and a direction parallel to the Z' axis is a "Z' axis direction." In addition, the direction of the tip of the arrow on the X' axis, the Y" axis and the Z' axis is called "+(positive)," and the direction opposite to the arrow is called "−(negative)." In addition, a plane specified by the X' axis and the Y" axis is called an "X'Y" plane." The same applies to other planes specified by other axes. Here, for convenience, the +Y" axis direction will be described as an upward direction, and the −Y" axis direction will be described as a downward direction, but upward and downward directions of a quartz crystal resonator 10, a quartz crystal resonator unit 1 and a quartz crystal oscillator 100 are not limited thereto.

First Embodiment

Figure 1:
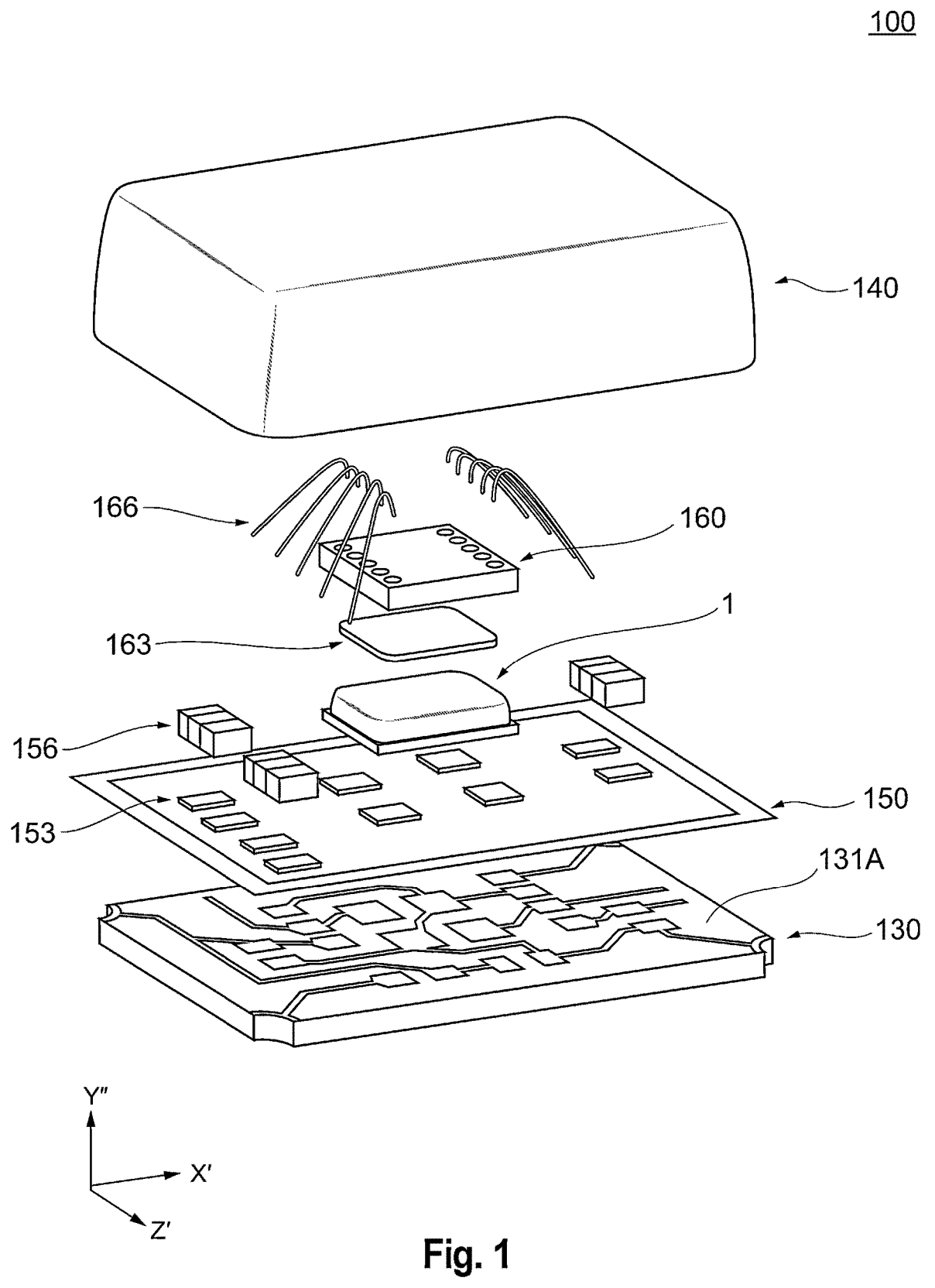

First, a schematic configuration of the quartz crystal oscillator 100 according to a first embodiment of the present invention will be described with reference to FIG. 1 and FIG. 2. FIG. 1 is an exploded perspective view schematically showing a configuration of the quartz crystal oscillator according to the first embodiment. FIG. 2 is a cross-sectional view schematically showing the configuration of the quartz crystal oscillator according to the first embodiment. FIG. 2 shows a cross section parallel to the X'Y" plane.

The quartz crystal oscillator 100 includes the quartz crystal resonator unit 1, an external substrate 130, an external cap 140, a sealing frame 150, a solder 153, a capacitor 156, an IC chip 160, a die bonding material 163 and a bonding wire 166. The quartz crystal resonator unit 1, the solder 153, the capacitor 156, the IC chip 160, the die bonding material 163 and the bonding wire 166 are sealed in a space formed between the external substrate 130 and the external cap 140. This space is, for example, liquid-tightly sealed, but may be air-tightly sealed in a vacuum state or may be air-tightly sealed while filled with a gas such as an inert gas.

The quartz crystal resonator unit 1 is a type of piezoelectric resonator unit, and is a quartz crystal resonator unit including a quartz crystal resonator. The quartz crystal resonator uses a quartz crystal element as a piezoelectric element that is excited according to a piezoelectric effect. The quartz crystal resonator unit 1 is mounted on the external substrate 130, and is sealed in a space formed between the external substrate 130 and the external cap 140.

The external substrate 130 is a flat plate-shaped circuit substrate having an upper surface 131A and a lower surface 131B which face each other. The external substrate 130 is provided using, for example, alumina. A wiring layer is provided on the upper surface 131A, and a terminal (not shown) is provided on the lower surface 131B. A castellation electrode provided by metallizing a semi through-hole is provided on the side surface of the external substrate 130, and the wiring layer on the upper surface 131A and the terminal on the lower surface 131B are electrically connected by the castellation electrode.

The external cap 140 has a bottomed opening for accommodating the quartz crystal resonator unit 1 on the side of the external substrate 130. In other words, the external cap 140 has a flat plate-shaped top wall portion and a side wall portion that extends from the outer edge of the top wall portion toward the external substrate 130. The top wall portion faces the external substrate 130 with the quartz crystal resonator unit 1 therebetween, and the side wall portion surrounds the quartz crystal resonator unit 1 in a plane direction parallel to the upper surface 131A of the external substrate 130.

The sealing frame 150 bonds the external substrate 130 and the external cap 140. Specifically, the upper surface 131A of the external substrate 130 and the tip of the side wall portion of the external cap 140 are bonded. The sealing frame 150 is provided in a rectangular frame shape, and surrounds the quartz crystal resonator unit 1, the capacitor 156, the IC chip 160 and the like when the upper surface 131A of the external substrate 130 is viewed in a plan view. The sealing frame 150 is provided, for example, with an electrically insulating resin adhesive.

The capacitor 156 is mounted on the upper surface 131A of the external substrate 130. The capacitor 156 is electrically connected to the quartz crystal resonator unit 1 or the IC chip 160 through a wiring layer of the external substrate 130. The capacitor 156 is, for example, a part of an oscillation circuit that oscillates the quartz crystal resonator unit 1.

The solder 153 bonds the wiring layer of the external substrate 130 and the quartz crystal resonator unit 1, and bonds the wiring layer of the external substrate 130 and the capacitor 156.

The IC chip 160 is mounted on, for example, the quartz crystal resonator unit 1. The IC chip 160 is an application specific integrated circuit (ASIC) including an oscillation circuit of the quartz crystal resonator unit 1. The IC chip 160 is, for example, a part of a circuit that corrects temperature characteristics of the quartz crystal resonator unit 1.

The die bonding material 163 bonds the quartz crystal resonator unit 1 and the IC chip 160. The die bonding material 163 is provided, for example, with a resin adhesive. For example, the die bonding material 163 has conductivity, and the quartz crystal resonator unit 1 is grounded through the die bonding material 163. The die bonding material 163 preferably contains a low elastic resin, for example, a silicone resin. Accordingly, the stress acting on the IC chip 160 can be alleviated. In addition, the die bonding material 163 is preferably formed of a material having high thermal conductivity. Accordingly, the followability of the temperature of the IC chip 160 with respect to the temperature of the quartz crystal resonator unit 1 is improved.

The bonding wire 166 electrically connects the IC chip 160 to the wiring layer of the external substrate 130.

Here, the quartz crystal oscillator 100 shows an example including the quartz crystal resonator unit 1 including the quartz crystal resonator 10 according to one embodiment of the present invention, and the present invention is not limited to the configuration shown in FIG. 1 and FIG. 2. For example, the external substrate 130 may have a box shape having a recess in which the quartz crystal resonator unit 1 can be accommodated, and the external cap 140 may have a flat plate shape. For example, the IC chip 160 may be provided on the external substrate 130 or the external cap 140, and at least a part of the oscillation circuit may be built in the quartz crystal resonator unit 1. In addition, some of parts shown in FIG. 1 and FIG. 2 may be omitted, and parts not shown in FIG. 1 and FIG. 2 may be provided. For example, the quartz crystal oscillator 100 may further include a thermostatic chamber that keeps the temperature of the quartz crystal resonator unit 1 constant.

Figure 3:
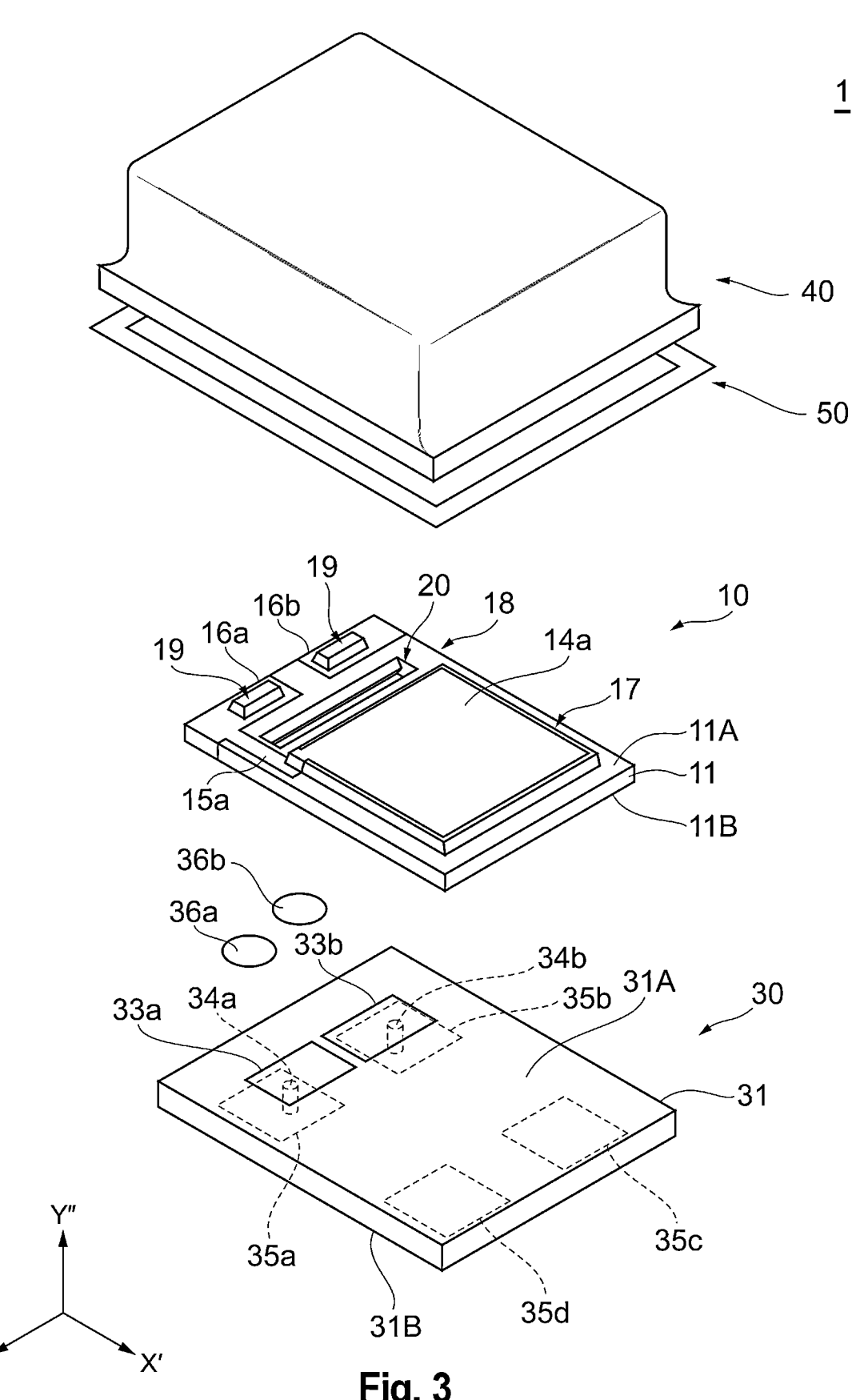
FIG. 3 is an exploded perspective view schematically showing a structure of a quartz crystal resonator unit according to the first embodiment.
Figure 4:
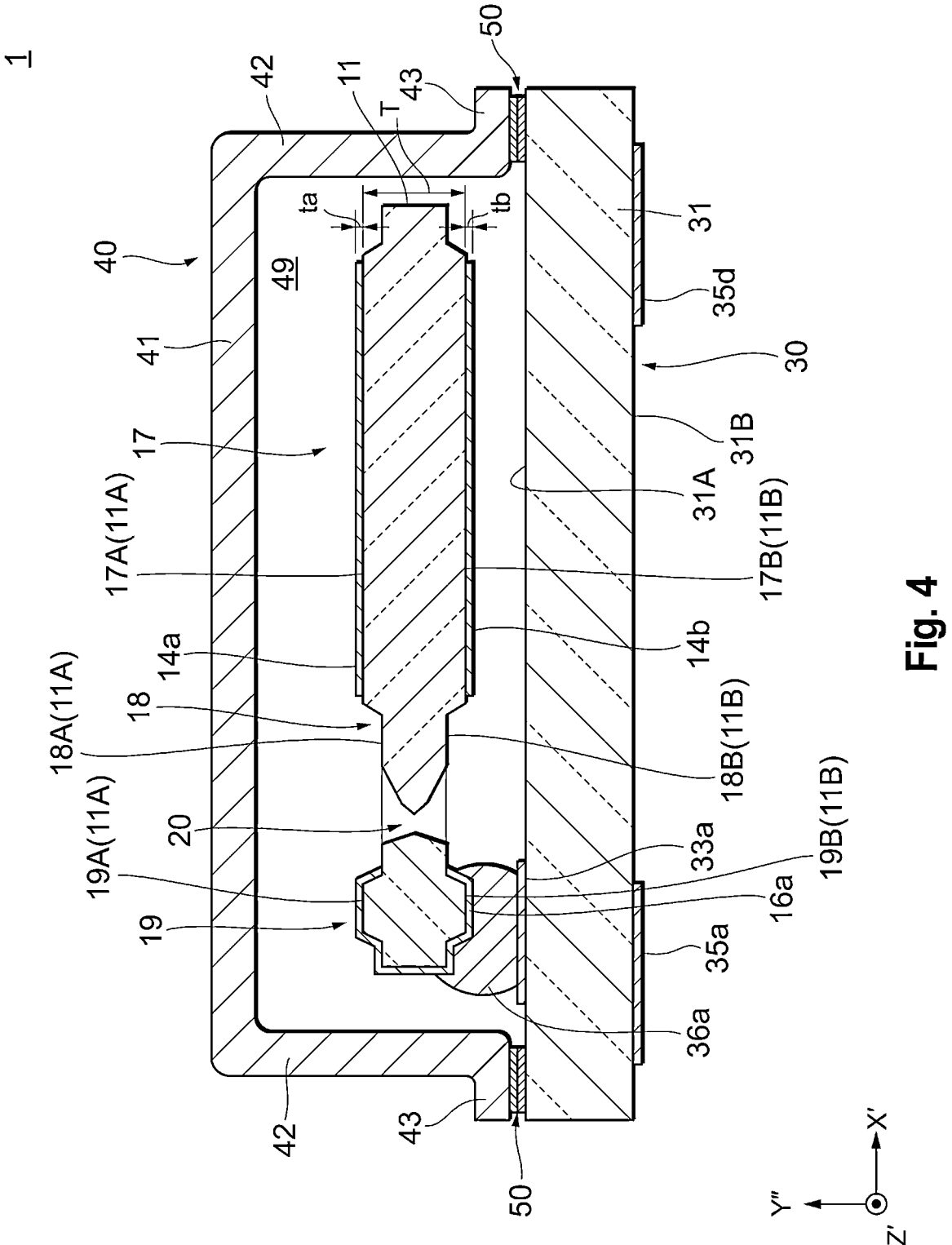
FIG. 4 is a cross-sectional view schematically showing a configuration of the quartz crystal resonator unit according to the first embodiment.

Next, the configuration of the quartz crystal resonator unit 1 according to the first embodiment of the present invention will be described with reference to FIG. 3 and FIG. 4. FIG. 3 is an exploded perspective view schematically showing the structure of the quartz crystal resonator unit according to the first embodiment. FIG. 4 is a cross-sectional view schematically showing the configuration of the quartz crystal resonator unit according to the first embodiment. FIG. 4 shows a cross section parallel to the X'Y" plane.

The quartz crystal resonator unit 1 includes the quartz crystal resonator 10, a base member 30, a lid member 40, and a bonding member 50. The quartz crystal resonator 10 is provided between the base member 30 and the lid member 40. The base member 30 and the lid member 40 form a holder for accommodating the quartz crystal resonator 10. In the example shown in FIG. 3 and FIG. 4, the base member 30 has a flat plate shape, and the quartz crystal resonator 10 is accommodated in a recess 49 of the lid member 40. However, the shapes of the base member 30 and the lid member 40 are not limited to the above shapes as long as at least the excited part of the quartz crystal resonator 10 is accommodated in the holder. For example, the base member 30 may have a recess in which at least a part of the quartz crystal resonator 10 is accommodated on the side of the lid member 40.

First, the quartz crystal resonator 10 will be described. The quartz crystal resonator 10 is a device that converts electrical energy and mechanical energy into each other by vibrating quartz crystal using a piezoelectric effect. The quartz crystal resonator 10 includes a quartz crystal element 11 having a shape of a thin chip, a first excitation electrode 14a and a second excitation electrode 14b constituting a pair of excitation electrodes, a first extension electrode 15a and a second extension electrode 15b constituting a pair of extension electrodes, and a first connection electrode 16a and a second connection electrode 16b constituting a pair of connection electrodes.

The quartz crystal element 11 has an upper surface 11A and a lower surface 11B which face each other. The upper surface 11A is positioned on the side opposite to the side facing the base member 30, that is, the side facing a top wall portion 41 of the lid member 40 to be described below. The lower surface 11B is positioned on the side facing the base member 30. The upper surface 11A and the lower surface 11B correspond to a pair of main surfaces of the quartz crystal element 11.

For example, the main surfaces 11A and 11B of the quartz crystal element 11 are planes parallel to the X'Z' plane. The quartz crystal element 11 is formed by etching a quartz crystal substrate (for example, a quartz crystal wafer) obtained by cutting and polishing a crystal body of synthetic quartz crystal. The main vibration of the quartz crystal resonator 10 using the quartz crystal element 11 is a thickness shear vibration mode. Here, the main surface of the quartz crystal element 11 is not limited to a flat surface as long as it can be obtained from the X'Z' plane, and may be a curved surface such as a concave surface or a convex surface, or an inclined surface inclined with respect to the X'Z' plane. The main surface of the quartz crystal element 11 may be a combination of a flat surface, a curved surface and an inclined surface.

The quartz crystal element 11 has a plate shape with a long side direction in which the long side parallel to the X' axis direction extends, a short side direction in which the short side parallel to the Z' axis direction extends, and a thickness direction in which the thickness parallel to the Y″ axis direction extends. When the upper surface 11A of the quartz crystal element 11 is viewed in a plan view, the planar shape of the quartz crystal element 11 is a rectangular shape.

When the upper surface 11A of the quartz crystal element 11 is viewed in a plan view, the quartz crystal element 11 has an excitation portion 17 that is positioned at the center and contributes to excitation, a peripheral portion 18 adjacent to the excitation portion 17, and a connection portion 19 connected to the base member 30. The excitation portion 17 is provided in a rectangular island shape, and is surrounded by the frame-shaped peripheral portion 18. The connection portion 19 is positioned on the end side of the quartz crystal element 11 in the +X axis, and is provided in a pair of rectangular island shapes arranged in the Z' axis direction.

The connection portion 19 is separated from the excitation portion 17, and the peripheral portion 18 is positioned between the excitation portion 17 and the connection portion 19.

Here, the planar shape of the quartz crystal element 11 when the upper surface 11A is viewed in a plan view is not limited to a rectangular shape. The planar shape of the quartz crystal element 11 may be a polygonal shape, a circular shape, an elliptical shape or a combination thereof. The planar shape of the excitation portion 17 is not limited to a rectangular shape, and the planar shape of the peripheral portion 18 is not limited to a frame shape. For example, the excitation portion 17 and the peripheral portion 18 may be formed in a band shape over the entire width of the quartz crystal element 11 in the Z' axis direction. The planar shape of the connection portion 19 is not limited to a pair of rectangular island shapes. The planar shape of the connection portion 19 may be a polygonal shape, a circular shape, an elliptical shape or a combination thereof. In addition, the connection portion 19 may be provided in one continuous band shape that extends in the Z' axis direction. In other words, both the first connection electrode 16a and the second connection electrode 16b may be provided in one connection portion 19.

The excitation portion 17 has an upper surface 17A and a lower surface 17B, the peripheral portion 18 has an upper surface 18A and a lower surface 18B, and the connection portion 19 has an upper surface 19A and a lower surface 19B. The upper surfaces 17A, 18A, and 19A are each a part of the upper surface 11A of the quartz crystal element 11. The lower surfaces 17B, 18B, and 19B are each a part of the lower surface 11B of the quartz crystal element 11. The upper surface 17A and the lower surface 17B correspond to a pair of main surfaces of the quartz crystal element 11 in the excitation portion 17. The upper surface 18A and the lower surface 18B correspond to a pair of main surfaces of the quartz crystal element 11 in the peripheral portion 18. The upper surface 19A and the lower surface 19B correspond to a pair of main surfaces of the quartz crystal element 11 in the connection portion 19. The upper surfaces 17A, 18A, and 19A and the lower surfaces 17B, 18B, and 19B are each the X'Z' plane.

The quartz crystal element 11 has a so-called mesa-type structure in which the thickness of the excitation portion 17 is larger than the thickness of the peripheral portion 18. According to the quartz crystal element 11 having a mesa-type structure in the excitation portion 17, vibration leakage of the quartz crystal resonator 10 can be minimized. The quartz crystal element 11 has a double-sided mesa-type structure, and the excitation portion 17 protrudes from the peripheral portion 18 on both sides of the upper surface 11A and the lower surface 11B. The boundary between the excitation portion 17 and the peripheral portion 18 has a tapered shape in which the thickness continuously changes. In other words, the surface connecting the upper surfaces 17A and 18A of the excitation portion 17 and the peripheral portion 18 and the surface connecting the lower surfaces 17B and 18B are inclined surfaces having a uniform inclination.

The boundary between the excitation portion 17 and the peripheral portion 18 may have a step shape in which the change in thickness is discontinuous. The boundary may have a convex structure in which the amount of change in thickness changes continuously or a bevel structure in which the amount of change in thickness changes discontinuously. In other words, the surface connecting the upper surfaces 17A and 18A of the excitation portion 17 and the peripheral portion 18 and the surface connecting the lower surfaces 17B and 18B may be composed of a plurality of inclined surfaces or may include a curved surface. In addition, the excitation portion 17 may have a single-sided mesa-type structure that protrudes from the peripheral portion 18 on one side of the upper surface 11A or the lower surface 11B of the quartz crystal element 11. In addition, the quartz crystal element 11 may have a so-called inverted mesa-type structure in which the thickness of the excitation portion 17 is smaller than the thickness of the peripheral portion 18. The quartz crystal element 11 may have a flat plate shape in which the thickness of the excitation portion 17 and the thickness of the peripheral portion 18 are substantially equal to each other.

The quartz crystal element 11 has a mesa-type structure in the connection portion 19 like the excitation portion 17. In other words, the thickness of the connection portion 19 is larger than the thickness of the peripheral portion 18. According to the quartz crystal element 11 having a mesa-type structure in the connection portion 19, the bonding strength with electrically conductive holding members 36a and 36b of the quartz crystal resonator 10 is improved. For example, the mesa-type structure in the connection portion 19 is simultaneously formed according to the same process as in the mesa-type structure in the excitation portion 17.

A hole or groove may be formed in the peripheral portion 18 between the excitation portion 17 and the connection portion 19. Such a hole or groove can minimize vibration leakage from the excitation portion 17 to the connection portion 19, and can reduce the equivalent resistance value (CI value) of the quartz crystal resonator 10. In addition, such a hole or groove can minimize propagation of stress from the connection portion 19 to the excitation portion 17, and minimize the fluctuation in the frequency of the quartz crystal resonator 10.

The first excitation electrode 14a and the second excitation electrode 14b are a pair of electrodes that apply a voltage to the excitation portion 17 of the quartz crystal element 11. The first excitation electrode 14a is provided on the upper surface 17A of the excitation portion 17, and the second excitation electrode 14b is provided on the lower surface 17B of the excitation portion 17. The first excitation electrode 14a and the second excitation electrode 14b face each other with the quartz crystal element 11 therebetween. When the upper surface 11A of the quartz crystal element 11 is viewed in a plan view, the first excitation electrode 14a and the second excitation electrode 14b each have a rectangular shape, and are arranged to overlap substantially entirely.

Here, the planar shapes of the first excitation electrode 14a and the second excitation electrode 14b when the upper surface 11A of the quartz crystal element 11 is viewed in a plan view are not limited to a rectangular shape. The planar shapes of the first excitation electrode 14a and the second excitation electrode 14b may be a polygonal shape, a circular shape, an elliptical shape or a combination thereof.

The first extension electrode 15a is provided on the upper surface 18A of the peripheral portion 18, and the second extension electrode 15b is provided on the lower surface 18B of the peripheral portion 18. The first extension electrode 15a electrically connects the first excitation electrode 14a and the first connection electrode 16a. The second extension electrode 15b electrically connects the second excitation electrode 14b and the second connection electrode 16b. One end of the first extension electrode 15a is connected to the first excitation electrode 14a in the excitation portion 17, and the other end of the first extension electrode

15a is connected to the first connection electrode 16a in the connection portion 19. In addition, one end of the second extension electrode 15b is connected to the second excitation electrode 14b in the excitation portion 17, and the other end of the second extension electrode 15b is connected to the second connection electrode 16b in the connection portion 19.

The first connection electrode 16a and the second connection electrode 16b are provided on the lower surface 19B of the connection portion 19. The first connection electrode 16a and the second connection electrode 16b are also provided on the upper surface 19A of the connection portion 19 and the side surface of the quartz crystal element 11.

One electrode group including the first excitation electrode 14a, the first extension electrode 15a and the first connection electrode 16a is formed continuously, for example, formed integrally. Similarly, the other electrode group including the second excitation electrode 14b, the second extension electrode 15b and the second connection electrode 16b is also formed continuously, for example, formed integrally. In this manner, a pair of electrode groups are provided in the quartz crystal resonator 10. The pair of electrode groups of the quartz crystal resonator 10 have, for example, a multi-layer structure, and the base layer and the outmost layer are laminated in this order. The base layer is a layer that comes into contact with the quartz crystal element 11, and is formed of a material having favorable adhesion to the quartz crystal element 11. The outmost layer is a layer that is positioned on the outermost surface of the pair of electrode groups, and is formed of a material having favorable chemical stability. When the pair of electrode groups is formed to have such a multi-layer structure, oxidation of the pair of electrode groups and peeling off of the pair of electrode groups from the quartz crystal element 11 can be minimized, so the quartz crystal resonator 10 having high reliability can be provided. The base layer contains, for example, chromium (Cr), and the outmost layer contains, for example, gold (Au).

If a voltage can be applied to the excitation portion 17, at least one of the pair of electrode groups of the quartz crystal resonator 10 may be provided apart from the quartz crystal element 11. For example, a gap may be provided between the first excitation electrode 14a and the excitation portion 17.

The material constituting the pair of electrode groups of the quartz crystal resonator 10 is not limited to Cr and Au, and may include a metal material, for example, titanium (Ti), molybdenum (Mo), aluminum (Al), nickel (Ni), indium (In), palladium (Pd), silver (Ag), copper (Cu), tin (Sn), and iron (Fe). The pair of electrode groups may contain an electrically conductive ceramic, an electrically conductive resin, a semiconductor or the like.

Next, the thickness T of the quartz crystal element 11 and the thickness t of the electrode provided in contact with the quartz crystal element 11 will be described.

The thickness T of the quartz crystal element 11 is the thickness of the excitation portion 17. When the quartz crystal element 11 has a convex structure or a bevel structure, and the thickness of the excitation portion 17 is not uniform, the thickness T of the quartz crystal element 11 is, for example, the thickness of the center part of the excitation portion 17.

As shown in FIG. 4, when both of the pair of electrodes (the first excitation electrode 14a and the second excitation electrode 14b) are provided in contact with the quartz crystal element 11, the thickness t of the electrode provided in contact with the quartz crystal element 11 is the sum of the thickness ta of the first excitation electrode 14a and the thickness tb of the second excitation electrode 14b (t=ta+tb). For example, the thickness ta of the first excitation electrode 14a is the thickness of the center part of the first excitation electrode 14a, and the thickness tb of the second excitation electrode 14b is the thickness of the center part of the second excitation electrode 14b. However, when one electrode of the first excitation electrode 14a and the second excitation electrode 14b is provided apart from the quartz crystal element 11, the thickness t is equal to the thickness of the other electrode provided in contact with the quartz crystal element 11. For example, when a gap is provided between the first excitation electrode 14a and the excitation portion 17, the thickness t is the thickness tb of the second excitation electrode 14b (t=tb).

The thickness T of the quartz crystal element 11 and the thickness t of the electrode provided in contact with the quartz crystal element 11 satisfy the relationship of t/T≥0.01. In other words, the ratio t/T of the thickness t of the electrode to the thickness T of the quartz crystal element 11 is 0.01 or more. The thickness ratio t/T is preferably 0.02 or more, more preferably 0.05 or more, and still more preferably 0.1 or more. In addition, the thickness ratio t/T is preferably 0.5 or less.

When the main vibration of the quartz crystal resonator 10 is the thickness shear vibration mode, in order to increase the frequency of the quartz crystal resonator 10, it is necessary to make the quartz crystal resonator 10 thin. Since it is more difficult to make the electrode provided in contact with the quartz crystal element 11 thinner than to make the quartz crystal element 11 thinner, when the quartz crystal resonator 10 is made thinner, the thickness ratio t/T increases. Therefore, in order to increase the frequency of the quartz crystal resonator 10, it is necessary to increase thickness ratio t/T. However, when the thickness ratio UT becomes larger, the influence of the electrode on frequency-temperature characteristics becomes larger.

Next, the base member 30 will be described. The base member 30 holds the quartz crystal resonator 10 in an excitable manner. The base member 30 includes a substrate 31 having an upper surface 31A and a lower surface 31B which face each other. The upper surface 31A and the lower surface 31B correspond to a pair of main surfaces of the substrate 31. The upper surface 31A is positioned on the side facing the quartz crystal resonator 10 and the lid member 40, and corresponds to a mounting surface on which the quartz crystal resonator 10 is mounted. The lower surface 31B is positioned on the side facing the external substrate 130, and corresponds to a mounting surface to which the external substrate 130 is connected. The substrate 31 is, for example, a sintered material such as an insulating ceramic (alumina). In order to minimize the occurrence of thermal stress, the substrate 31 is preferably formed of a heat resistant material. In order to minimize stress applied to the quartz crystal resonator 10 by a thermal history, the substrate 31 may be formed of a material having a coefficient of thermal expansion close to that of the quartz crystal element 11, or may be formed of, for example, a quartz crystal. In addition, in order to minimize damage on the substrate 31 due to thermal stress, the substrate 31 may be formed of a material having a coefficient of thermal expansion close to that of the lid member 40.

The base member 30 includes a first electrode pad 33a and a second electrode pad 33b. The first electrode pad 33a and a second electrode pad 33b are provided on the upper surface 31A of the substrate 31. The first electrode pad 33a and the second electrode pad 33b are terminals for electrically connecting the quartz crystal resonator 10 to the base member 30. In order to minimize a decrease in reliability due to oxidation, the outmost layers of the first electrode pad 33a and the second electrode pad 33b preferably contain gold, and more preferably contain almost only gold. For example, the first electrode pad 33a and the second electrode pad 33b may have a laminated structure having a base layer for improving adhesion to the substrate 31 and the outmost layer that contains gold and minimizes oxidation. The first electrode pad 33a and the second electrode pad 33b correspond to a pair of electrode pads.

The base member 30 includes a first external electrode 35a, a second external electrode 35b, a third external electrode 35c and a fourth external electrode 35d. The first external electrode 35a to the fourth external electrode 35d are provided on the lower surface 31B of the substrate 31. The first external electrode 35a and the second external electrode 35b are terminals for electrically connecting the wiring layer of the external substrate 130 and the quartz crystal resonator unit 1. Although the third external electrode 35c and the fourth external electrode 35d are, for example, dummy electrodes to and from which an electrical signal and the like are not input and output, they may be ground electrodes that improve an electromagnetic shield function of the lid member 40 by grounding the lid member 40. Here, the third external electrode 35c and the fourth external electrode 35d may be omitted.

The first electrode pad 33a is electrically connected to the first external electrode 35a via a first through electrode 34a that penetrates the substrate 31 in the Y" axis direction. The second electrode pad 33b is electrically connected to the second external electrode 35b via a second through electrode 34b that penetrates the substrate 31 in the Y" axis direction.

The first electrode pad 33a and the second electrode pad 33b may be electrically connected to the first external electrode 35a and the second external electrode 35b via a side electrode provided on the side surface connecting the upper surface 31A and the lower surface 31B of the substrate 31. The side electrode may be a castellation electrode.

The base member 30 includes the first electrically conductive holding member 36a and the second electrically conductive holding member 36b. The first electrically conductive holding member 36a and the second electrically conductive holding member 36b hold the quartz crystal resonator 10 in an excitable manner. In other words, the quartz crystal resonator 10 is held so that the excitation portion 17 does not come into contact with the base member 30 and the lid member 40. The first electrically conductive holding member 36a and the second electrically conductive holding member 36b electrically connect the quartz crystal resonator 10 and the base member 30. Specifically, the first electrically conductive holding member 36a electrically connects the first electrode pad 33a and the first connection electrode 16a, and the second electrically conductive holding member 36b electrically connects the second electrode pad 33b and the second connection electrode 16b. The first electrically conductive holding member 36a and the second electrically conductive holding member 36b correspond to a pair of electrically conductive holding members.

The first electrically conductive holding member 36a and the second electrically conductive holding member 36b are cured products of an electrically conductive adhesive containing a thermosetting resin, a photocurable resin or the like. The main component of the first electrically conductive holding member 36a and the second electrically conductive holding member 36b is, for example, a silicone resin. The first electrically conductive holding member 36a and the second electrically conductive holding member 36*b* contain electrically conductive particles, and for example, metal particles containing silver (Ag) are used as the electrically conductive particles.

The main component of the first electrically conductive holding member 36*a* and the second electrically conductive holding member 36*b* is not limited to the silicone resin as long as it is a curable resin, and for example, an epoxy resin or an acrylic resin may be used. In addition, the conductivity of the first electrically conductive holding member 36*a* and the second electrically conductive holding member 36*b* is not limited to being imparted from silver particles, but may be imparted from other metals, electrically conductive ceramics, electrically conductive organic materials or the like. The main component of the first electrically conductive holding member 36*a* and the second electrically conductive holding member 36*b* may be an electrically conductive polymer.

The resin composition of the first electrically conductive holding member 36*a* and the second electrically conductive holding member 36*b* may contain any additive. The additive is, for example, a tackifier, a filling agent, a thickener, a sensitizer, an anti-aging agent, or an antifoaming agent in order to improve the workability and storability of the electrically conductive adhesive. In addition, a filler may be added in order to increase the strength of the cured product or to maintain the interval between the base member 30 and the quartz crystal resonator 10.

Next, the lid member 40 will be described. The lid member 40 is bonded to the base member 30. The lid member 40 forms an internal space in which the quartz crystal resonator 10 is accommodated with the base member 30. The lid member 40 has the recess 49 that opens on the side of the base member 30, and the internal space in the present embodiment corresponds to the space inside the recess 49. For example, the recess 49 is sealed in a vacuum state, but may be sealed while filled with an inert gas such as nitrogen or a rare gas. The recess 49 may be sealed in a liquid-tight state. The material of the lid member 40 is preferably an electrically conductive material, and more preferably a highly air-tight metal material. Since the lid member 40 is formed of an electrically conductive material, an electromagnetic shield function for reducing electromagnetic waves input and output to and from the internal space is imparted to the lid member 40. In addition, the IC chip 160 can be grounded through the lid member 40. In order to minimize the occurrence of thermal stress, the material of the lid member 40 is preferably a material having a coefficient of thermal expansion close to that of the substrate 31, for example, a Fe—Ni—Co alloy whose coefficient of thermal expansion near room temperature matches that of glass or a ceramic in a wide temperature range. Here, the material of the lid member 40 may be the same as the material of the substrate 31, and may include a ceramic, a crystal, a resin and the like.

The lid member 40 has a flat plate-shaped top wall portion 41 and a side wall portion 42 that is connected to the outer edge of the top wall portion 41 and extends in a height direction. The recess 49 of the lid member 40 is formed by the top wall portion 41 and the side wall portion 42. Specifically, the top wall portion 41 extends along the upper surface 31A of the substrate 31 and faces the base member 30 with the quartz crystal resonator 10 therebetween in the height direction. In addition, the side wall portion 42 extends from the top wall portion 41 toward the base member 30, and surrounds the quartz crystal resonator 10 in a direction parallel to the upper surface 31A of the substrate 31. The lid member 40 further has a flange portion 43 that is connected to the tip of the side wall portion 42 on the side of the base member 30 and extends outward along the upper surface 31A of the substrate 31. In other words, the top wall portion 41 connected to the upper end part of the side wall portion 42 and the flange portion 43 connected to the lower end part of the side wall portion 42 extend in directions opposite to each other. When the upper surface 31A of the substrate 31 is viewed in a plan view, the flange portion 43 extends in a frame shape so that it surrounds the quartz crystal resonator 10.

Next, the bonding member 50 will be described. The bonding member 50 is provided over the entire circumference of each of the base member 30 and the lid member 40, and has a rectangular frame shape. When the upper surface 31A of the base member 30 is viewed in a plan view, the first electrode pad 33*a* and the second electrode pad 33*b* are arranged inside the bonding member 50, and the bonding member 50 is provided to surround the quartz crystal resonator 10. The bonding member 50 bonds the base member 30 and the lid member 40, and seals the recess 49 corresponding to the internal space. Specifically, the bonding member 50 bonds the substrate 31 and the flange portion 43. In order to minimize fluctuation in frequency characteristics of the quartz crystal resonator 10, it is preferable that the material of the bonding member 50 have low moisture permeability, and it is more preferable that the material have low gas permeability. In addition, in order to electrically connect the lid member 40 to the ground potential via the bonding member 50, it is preferable that the bonding member 50 have conductivity. In this regard, the material of the bonding member 50 is preferably a metal. As an example, the bonding member 50 includes a metallized layer formed of molybdenum (Mo) provided on the upper surface 31A of the substrate 31 and a metal solder layer formed of an gold-tin (Au—Sn) eutectic alloy provided between the metallized layer and the flange portion 43.

Here, the bonding member 50 may be formed of a silicon adhesive containing water glass or the like or an inorganic adhesive such as a calcium adhesive containing cement or the like. The material of the bonding member 50 may be formed of an organic adhesive such as an epoxy-based, vinyl-based, acrylic-based, urethane-based or silicone-based adhesive. When the bonding member 50 is formed of an inorganic or organic adhesive, in order to reduce the gas permeability, a coating having lower gas permeability than the adhesive may be provided outside the bonding member 50. The base member 30 and the lid member 40 may be bonded by seam welding.

Figure 5:
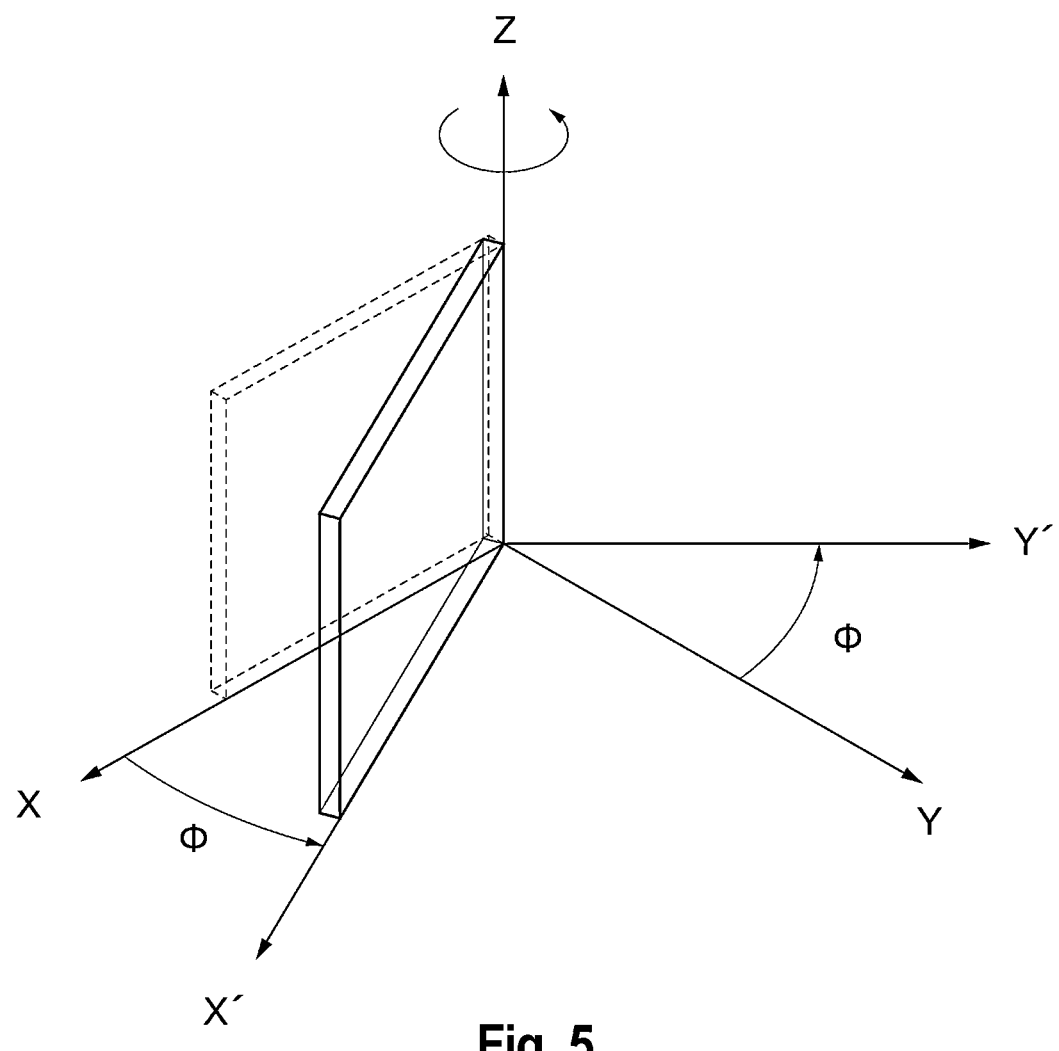
FIG. 5 is a diagram showing first rotation of a quartz crystal.
Figure 6:
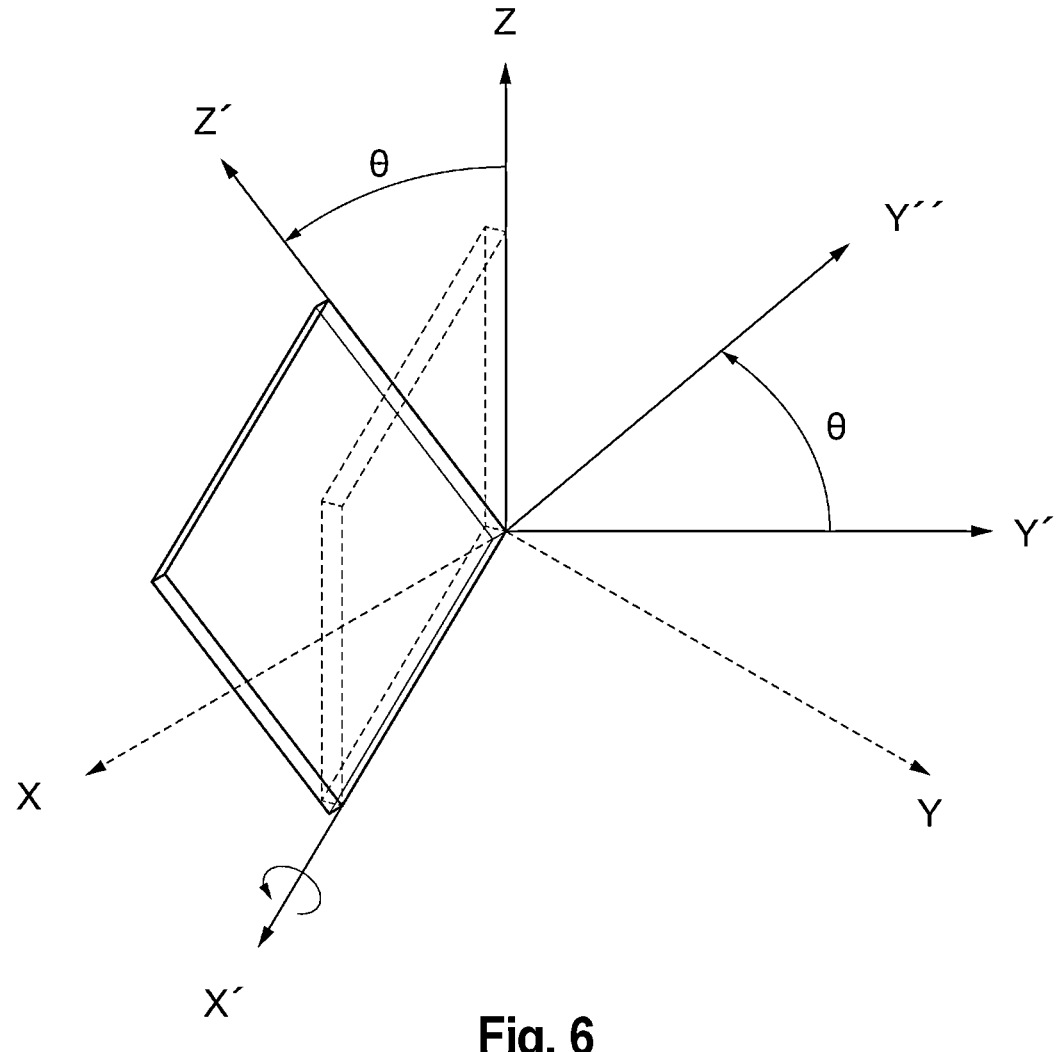
FIG. 6 is a diagram showing second rotation of a quartz crystal.
Figure 7:
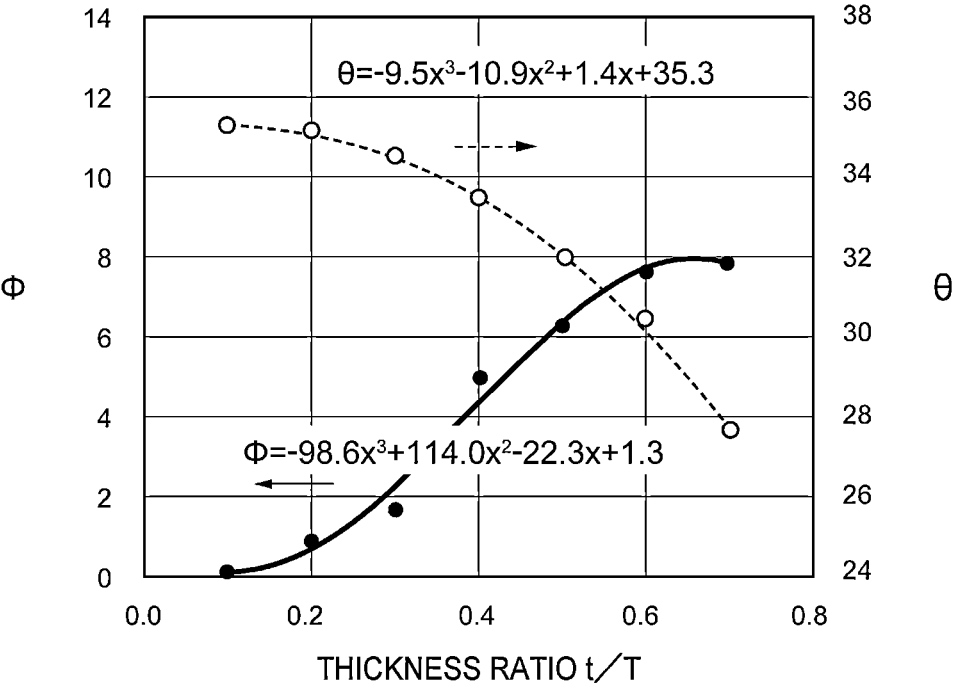
FIG. 7 is a graph showing an optimum rotation angle of a quartz crystal element.
Figure 8:
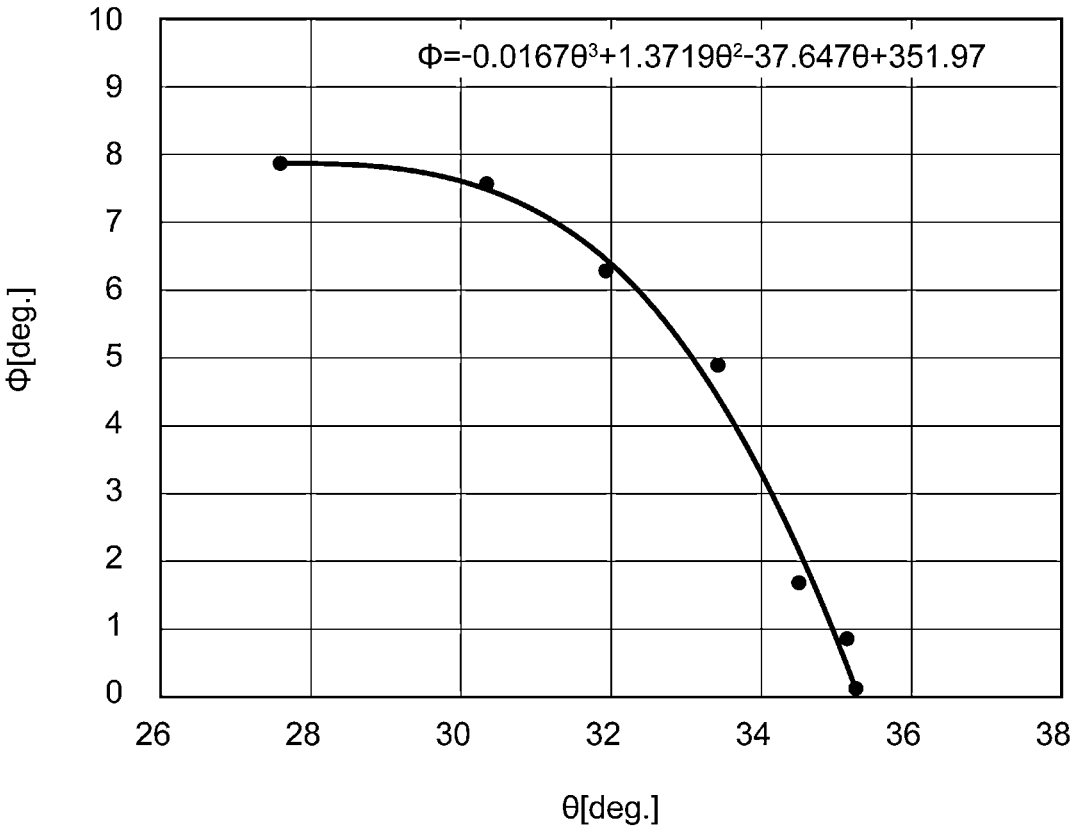
FIG. 8 is a graph showing an optimum rotation angle of a quartz crystal element.

Next, a cut angle of the quartz crystal element 11 will be described in more detail with reference to FIG. 5 to FIG. 8. FIG. 5 is a diagram showing first rotation of a quartz crystal. FIG. 6 is a diagram showing a second rotation angle of the quartz crystal. FIG. 7 is a graph showing an optimum rotation angle of a quartz crystal element. FIG. 8 is a graph showing an optimum rotation angle of the quartz crystal element.

The quartz crystal element 11 is formed of a quartz substrate obtained by rotating the Y plate twice. First, as shown in FIG. 5, the plane of the quartz crystal including the X axis and the Z axis is rotated by φ degrees around the Z axis. φ (degrees) corresponds to the rotation angle of the first rotation. The direction of the first rotation is a direction in which the positive direction side of the X axis is rotated on the positive direction side of the Y axis, and is a counter-clockwise direction when the XY plane is viewed in a plan view in the +Z axis direction. In this case, the X' axis and the Y' axis are obtained by performing first rotation of the X axis and the Y axis.

Next, as shown in FIG. 6, the plane obtained by the first rotation is rotated by θ degrees around the X' axis. θ (degrees) corresponds to the rotation angle of the second rotation. The direction of the second rotation is a direction in which the positive direction side of the Y' axis is rotated on the positive direction side of the Z axis, and is a counterclockwise direction when the Y'Z plane is viewed in a plan view in the +X' axis direction. In this case, the Y" axis and the Z' axis are obtained by performing second rotation of the Y' axis and the Z axis. In this manner, the main surface of the quartz crystal element 11 is obtained based on the Z'X' plane obtained by rotating the ZX plane twice.

In the graph in FIG. 7, the horizontal axis represents thickness ratio t/T, and the vertical axis represent rotation angle φ (degrees) of first rotation or rotation angle θ (degrees) of second rotation. In the graph in the drawing, rotation angles φ and θ at which the primary coefficient and the secondary coefficient of frequency-temperature characteristics become zero when the thickness ratio t/T is set as a variable x are plotted. From the approximation equation of the plot, it can be understood that the rotation angles φ and θ at which the primary coefficient and the secondary coefficient of frequency-temperature characteristics become zero satisfy the following equation.

$$\varphi = -98.6x^3 + 114.0x^2 - 22.3x + 1.3$$

$$\theta = -9.5x^3 - 10.9x^2 + 1.4x + 35.3$$

If the rotation angle φ is within ±5 degrees of the value obtained by the above equation and the rotation angle θ is within ±0.5 degrees of the value obtained by the above equation, frequency-temperature characteristics can be sufficiently improved. Therefore, in the present embodiment, the quartz crystal element 11 is provided so that the relationships of $|\varphi - (-98.6x^3 + 114.0x^2 - 22.3x + 1.3)| \le 5$ and $|\theta - (-9.5x^3 - 10.9x^2 + 1.4x + 35.3)| \le 0.5$ are satisfied.

In the graph in FIG. 8, the horizontal axis represents rotation angle θ of second rotation, and the vertical axis represents rotation angle φ of first rotation. In the graph in the drawing, the rotation angle φ at which the primary coefficient and the secondary coefficient of frequency-temperature characteristics becomes zero when the rotation angle θ is set as a variable is plotted. From the approximation equation of the plot, it can be understood that the rotation angles φ and θ at which the primary coefficient and the secondary coefficient of frequency-temperature characteristics become zero satisfy the following equation.

$$\varphi = -0.017\theta^3 + 1.37\theta^2 - 37.6\theta + 351$$

If the rotation angle φ is within ±5 degrees of the value obtained by the above equation, frequency-temperature characteristics can be sufficiently improved. Therefore, in the present embodiment, the quartz crystal element 11 is provided so that the relationship of $|\varphi - (-0.017\theta^3 + 1.37\theta^2 - 37.6\theta + 351)| \le 5$ is satisfied.

Figure 9:
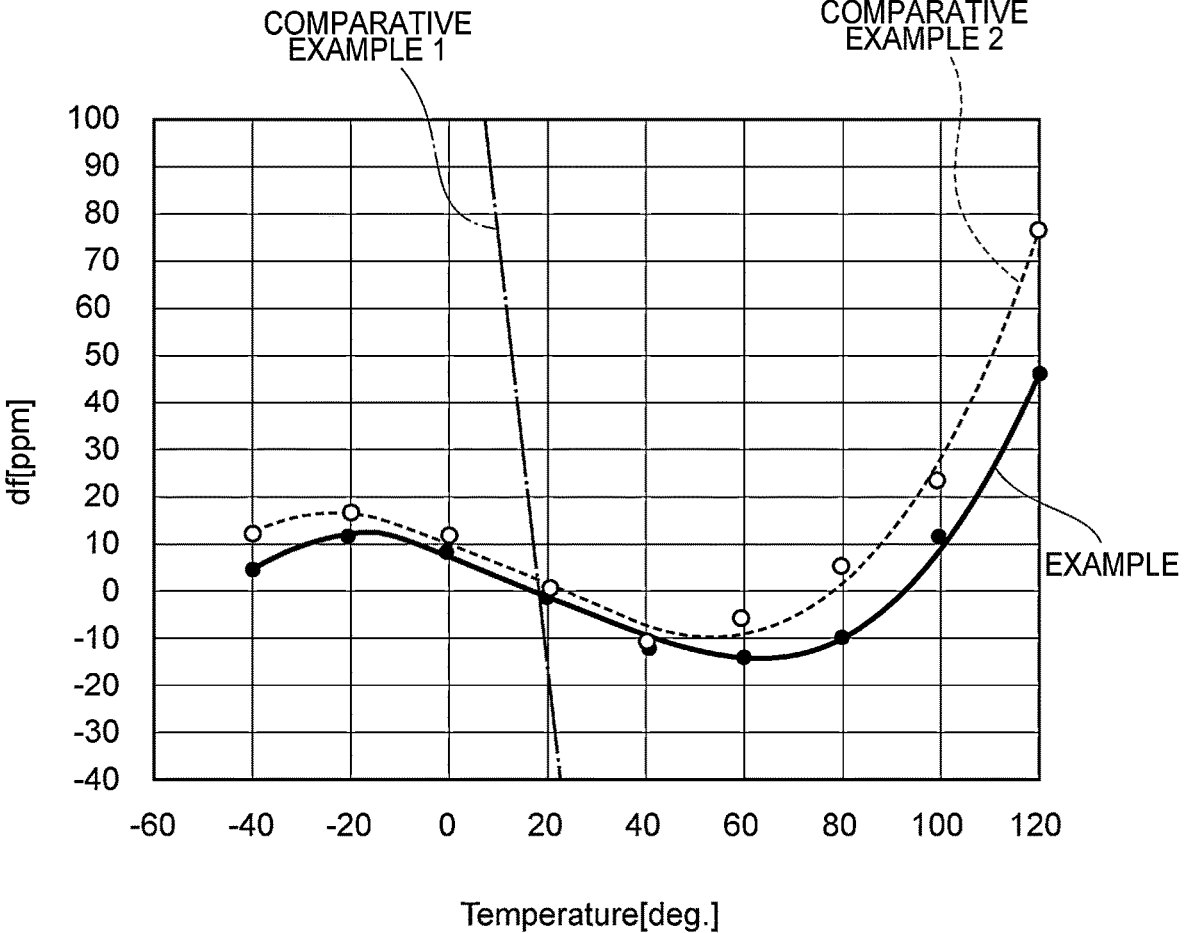
FIG. 9 is a graph showing frequency-temperature characteristics of examples.

Next, frequency-temperature characteristics of an example and comparative examples of the present invention will be described with reference to FIG. 9. The example is a quartz crystal resonator in which a pair of electrodes are provided on both sides of a quartz crystal element. The quartz crystal element and the pair of electrodes are each a rectangular flat plate. The pair of electrodes are formed of aluminum. The area of the main surface of the quartz crystal element is 120 μm², the thickness of the crystal is 1 μm, the area of the main surface of the electrode is 50 μm², the thickness of one of the electrodes is 0.2 μm, and the sum of the thicknesses of the pair of electrodes is 0.4 μm. The rotation angle φ of the first rotation is 4.9 degrees, and rotation angle θ of the second rotation is 33.4 degrees.

Comparative Example 1 and Comparative Example 2 differ only in the rotation angle from the example. Specifically, the quartz crystal element of Comparative Example 1 is an AT cut. In Comparative Example 1, the rotation angle φ is 0 degrees, and the rotation angle θ is 35 degrees and 25 minutes. In the quartz crystal element of Comparative Example 2, the rotation angle of the AT cut is modified so that frequency-temperature characteristics are improved. In Comparative Example 2, the rotation angle φ is 0 degrees, and the rotation angle θ is 33 degrees and 45 minutes.

Since the quartz crystal element is thin, frequency-temperature characteristics of Comparative Example 1 are greatly influenced by the electrode, and are worse than frequency-temperature characteristics of the quartz crystal resonator having t/T<0.01. Frequency-temperature characteristics of Comparative Example 2 are improved by correcting the primary coefficient compared to frequency-temperature characteristics of Comparative Example 1. However, it cannot be said that frequency-temperature characteristics of Comparative Example 2 are sufficiently improved, and the change in frequency in a high temperature range is large. Since the primary coefficient and the secondary coefficient become zero in frequency-temperature characteristics of the example, the temperature change in the frequency in the example is smaller than the temperature change in the frequency in Comparative Example 2.

As described above, in one embodiment, the thickness T of the quartz crystal element 11 and the thickness t of the electrode provided in contact with the quartz crystal element 11 satisfy the relationship of x=t/T≥0.01, and the relationships of $|\varphi - (-98.6x^3 + 114.0x^2 - 22.3x + 1.3)| \le 5$ and $|\theta - (-9.5x^3 - 10.9x^2 + 1.4x + 35.3)| \le 0.5$ are satisfied, and the relationship of $|\varphi - (-0.017\theta^3 + 1.37\theta^2 - 37.6\theta + 351)| \le 5$ is satisfied. Accordingly, the frequency-temperature characteristics are improved.

Hereinafter, some or all parts of the embodiment of the present invention will be supplemented and effects thereof will be described. Here, the present invention is not limited to the following appendices.

According to one aspect of the present invention, there is provided a quartz crystal resonator including a quartz crystal element having surfaces obtained by rotating a plane containing an X axis and a Z axis of a quartz crystal containing an X axis, a Y axis and a Z axis as crystallographic axes by φ degrees around the Z axis, and additionally performing rotation by θ degrees around an X' axis that is obtained by rotating the X axis by φ degrees as main surfaces, and electrode provided in contact with the quartz crystal element, wherein a thickness T of the quartz crystal element and a thickness t of the electrode provided in contact with the quartz crystal element satisfy the relationship of x=t/T≥0.01, and the relationships of $|\varphi - (-98.6x^3 + 114.0x^2 - 22.3x + 1.3)| \le 5$ and $|\theta - (-9.5x^3 - 10.9x^2 + 1.4x + 35.3)| \le 0.5$ are satisfied. Accordingly, frequency-temperature characteristics are improved.

According to another aspect of the present invention, there is provided a quartz crystal resonator including a quartz crystal element having surfaces obtained by rotating a plane containing an X axis and a Z axis of a quartz crystal containing an X axis, a Y axis and a Z axis as crystallographic axes by φ degrees around the Z axis, and additionally performing rotation by θ degrees around an X' axis that is obtained by rotating the X axis by $\varphi$ degrees as main surfaces; and electrode provided in contact with the quartz crystal element, wherein a thickness T of the quartz crystal element and a thickness t of the electrode provided in contact with the quartz crystal element satisfy the relationship of $x=t/T\geq0.01$, and the relationship of $|\varphi-(-0.017\theta^3+1.37\theta^2-37.6\theta+351)|\leq5$ is satisfied.

As an aspect, the thickness t of the electrode provided in contact with the quartz crystal element is a sum of thicknesses of a pair of electrodes that apply a voltage to the quartz crystal element.

As an aspect, the main vibration of the quartz crystal resonator is a thickness shear vibration mode.

As an aspect, the electrode provided in the quartz crystal element is formed of aluminum.

As an aspect, there is provided a quartz crystal resonator unit including any of the above quartz crystal resonators, a base member, and a lid member bonded to the base member, wherein the quartz crystal resonator is provided in an internal space between the base member and the lid member.

As an aspect, there is provided a quartz crystal oscillator including the above quartz crystal resonator unit and an IC chip including an oscillation circuit of the quartz crystal resonator unit.

The embodiment according to the present invention can be appropriately applied without particular limitation as long as it is a device that performs electromechanical energy conversion according to a piezoelectric effect such as a timing device, a sound generator, an oscillator, a load sensor or the like.

As described above, according to one aspect of the present invention, it is possible to provide a quartz crystal resonator, a quartz crystal resonator unit and a quartz crystal oscillator which have favorable frequency-temperature characteristics.

Here, it should be noted that the embodiments described above are provided in order to facilitate understanding of the present invention, and are not intended to limit the present invention. The present invention can be modified/improved without departing from the spirit of the invention, and the present invention includes equivalents thereof. That is, those obtained by performing appropriate design changing on the embodiments by those skilled in the art are included in the scope of the present invention as long as they include features of the present invention. For example, components of the embodiments and their dispositions, materials, conditions, shapes, sizes and the like are not limited to those exemplified, and can be appropriately changed. In addition, the components of the embodiments can be combined as much as technically possible, and the combinations thereof are also included in the scope of the present invention as long as they include features of the present invention.

REFERENCE SIGNS LIST

1 Quartz crystal resonator unit
10 Quartz crystal resonator
11 Quartz crystal element
14a, 14b Excitation electrode
15a, 15b Extension electrode
16a, 16b Connection electrode
17 Excitation portion
18 Peripheral portion
19 Connection portion
11A, 17A, 18A, 19A Upper surface
11B, 17B, 18B, 19B Lower surface
$\varphi$ Rotation angle of first rotation
$\theta$ Rotation angle of second rotation

What is claimed is:

1. A quartz crystal resonator, comprising:
a quartz crystal element having main surfaces extending in a plane $\varphi$ degrees around a Z axis of the quartz crystal element and $\theta$ degrees around an X' axis of the quartz crystal element; and
an electrode in contact with the quartz crystal element, where $$x=t/T\geq0.01,$$

$$0<\varphi,$$

$$|\varphi-(-98.6x^3+114.0x^2-22.3x+1.3)|\leq5, \text{ and}$$

$$|\theta-(-9.5x^3-10.9x^2+1.4x+35.3)|\leq0.5,$$

wherein T is a thickness of the quartz crystal element and t is a thickness of the electrode.

2. The quartz crystal resonator according to claim 1, wherein $0.02\leq t/T$.

3. The quartz crystal resonator according to claim 2, wherein $0.05\leq t/T$.

4. The quartz crystal resonator according to claim 3, wherein $0.1\leq t/T$.

5. The quartz crystal resonator according to claim 1, wherein $t/T\leq0.5$.

6. The quartz crystal resonator according to claim 1, wherein the thickness t is a sum of thicknesses of a pair of electrodes on the main surfaces of the quartz crystal element.

7. The quartz crystal resonator according to claim 1, wherein a main vibration of the quartz crystal resonator is a thickness shear vibration mode.

8. The quartz crystal resonator according to claim 1, wherein the electrode comprises aluminum.

9. A quartz crystal resonator unit, comprising:
the quartz crystal resonator according to claim 1;
a base member; and
a lid member bonded to the base member,
wherein the quartz crystal resonator is in an internal space between the base member and the lid member.

10. A quartz crystal oscillator, comprising:
the quartz crystal resonator unit according to claim 1; and
an IC chip operatively connected to the quartz crystal resonator unit, the IC chip including an oscillation circuit of the quartz crystal resonator unit.

11. A quartz crystal resonator, comprising:
a quartz crystal element having main surfaces extending in a plane $\varphi$ degrees around a Z axis of the quartz crystal element and $\theta$ degrees around an X' axis of the quartz crystal element; and
an electrode in contact with the quartz crystal element, where $$x=t/T\geq0.01,$$

$$0<\varphi, \text{ and}$$

$$|\varphi-(-0.017\theta^3+1.37\theta^2-37.6\theta+351)|\leq5,$$

wherein T is a thickness of the quartz crystal element and t is a thickness of the electrode.

12. The quartz crystal resonator according to claim 11, wherein $0.02\leq t/T$.

13. The quartz crystal resonator according to claim 12, wherein $0.05\leq t/T$.

14. The quartz crystal resonator according to claim 13, wherein $0.1\leq t/T$.

15. The quartz crystal resonator according to claim 11, wherein $t/T\leq0.5$.

16. The quartz crystal resonator according to claim 11, wherein the thickness t is a sum of thicknesses of a pair of electrodes on the main surfaces of the quartz crystal element.

17. The quartz crystal resonator according to claim 11, wherein a main vibration of the quartz crystal resonator is a thickness shear vibration mode.

18. The quartz crystal resonator according to claim 11, wherein the electrode comprises aluminum.

19. A quartz crystal resonator unit, comprising:

the quartz crystal resonator according to claim 11;

a base member; and a lid member bonded to the base member, wherein the quartz crystal resonator is in an internal space between the base member and the lid member.

20. A quartz crystal oscillator, comprising:

the quartz crystal resonator unit according to claim 19; and an IC chip operatively connected to the quartz crystal resonator unit, the IC chip including an oscillation circuit of the quartz crystal resonator unit.

* * * * *